(12) United States Patent
Wen (10) Patent No.: US 9,905,480 B1
(45) Date of Patent: Feb. 27, 2018

(54) SEMICONDUCTOR DEVICES AND METHODS FOR FORMING THE SAME (71) Applicant: Nuvoton Technology Corporation, Hsinchu Science Park (TW)

(72) Inventor: Wen-Ying Wen, Hsinchu County (TW)

(73) Assignee: NUVOTON TECHNOLOGY CORPORATION, Hsinchu Science Park (TW)

( * ) Notice: Subject to any disclaimer, the term of this patent is extended or adjusted under 35 U.S.C. 154(b) by 5 days.

(21) Appl. No.: 15/420,409

(22) Filed: Jan. 31, 2017

(30) Foreign Application Priority Data

Nov. 15, 2016 (TW) .............................. 105137203 A (51) Int. Cl.
| | |
|---|---|
| *H01L 21/336* | (2006.01) |
| *H01L 21/84* | (2006.01) |
| *H01L 21/308* | (2006.01) |
| *H01L 21/762* | (2006.01) |
| *H01L 27/12* | (2006.01) |
| H01L 21/8238 | (2006.01) |
| H01L 21/8234 | (2006.01) |

(52) U.S. Cl.
CPC ........ *H01L 21/845* (2013.01); *H01L 21/3081* (2013.01); *H01L 21/3086* (2013.01); *H01L 21/76205* (2013.01); *H01L 27/1211* (2013.01); *H01L 21/823431* (2013.01); *H01L 21/823821* (2013.01)

(58) Field of Classification Search
CPC ..... H01L 21/823412; H01L 21/823807; H01L 21/845; H01L 27/1211; H01L 29/66795; H01L 29/785; H01L 21/823431; H01L 21/823821; H01L 27/0886; H01L 27/0924
See application file for complete search history.

(56) References Cited

U.S. PATENT DOCUMENTS

| | | | | |
|---|---|---|---|---|
| 5,235,187 | A * | 8/1993 | Arney ..................... | B82Y 35/00 250/307 |
| 6,913,974 | B2 * | 7/2005 | Hung ................ | H01L 21/28273 257/E21.209 |
| 6,962,843 | B2 * | 11/2005 | Anderson ......... | H01L 29/66795 438/149 |

(Continued)

OTHER PUBLICATIONS

An Office Action from corresponding TW Application No. 150137203 dated Mar. 20, 2017; 3 pgs.

*Primary Examiner* — Mary Wilczewski
(74) *Attorney, Agent, or Firm* — Muncy, Geissler, Olds & Lowe, P.C.

(57) ABSTRACT

A method includes forming a first nitride layer on a semiconductor substrate, forming a first oxide layer on the first nitride layer, forming a first trench through the first oxide layer, the first nitride layer and a portion of the semiconductor substrate, forming a first spacer on a sidewall of the first trench, forming a second trench in the semiconductor substrate by using the first spacer as a mask, forming a third trench, forming a second oxide layer in the second trench, wherein the second oxide layer laterally extends into the semiconductor substrate and under the first spacer, forming a second spacer on a sidewall of the third trench, and removing a portion of the first nitride layer and a portion of the semiconductor substrate by etching and using the second spacer as a mask to form a fin structure on the second oxide layer.

8 Claims, 13 Drawing Sheets

(56) References Cited

U.S. PATENT DOCUMENTS

| | | | |
|---|---|---|---|
| 7,056,781 B2* | 6/2006 | Yoon | H01L 21/84 257/E21.703 |
| 7,259,425 B2* | 8/2007 | An | H01L 29/42384 257/288 |
| 7,279,774 B2* | 10/2007 | Seo | H01L 29/66795 257/619 |
| 7,301,207 B2* | 11/2007 | Kim | H01L 21/3065 257/374 |
| 7,763,514 B2* | 7/2010 | von Kluge | H01L 27/10876 257/E21.624 |
| 8,143,121 B2* | 3/2012 | Lin | H01L 27/10826 257/296 |
| 8,551,843 B1* | 10/2013 | Cai | H01L 21/28123 257/E21.19 |
| 8,691,640 B1* | 4/2014 | LiCausi | H01L 29/785 257/E21.421 |
| 8,716,156 B1* | 5/2014 | Pawlak | H01L 21/823821 438/770 |
| 8,766,362 B2* | 7/2014 | Loiko | H01L 21/84 257/347 |
| 8,835,323 B1* | 9/2014 | Shieh | H01L 21/3086 216/41 |
| 8,975,129 B1* | 3/2015 | Shieh | H01L 21/3086 438/199 |
| 9,117,877 B2* | 8/2015 | Cai | H01L 29/66795 |
| 9,147,616 B1* | 9/2015 | Jacob | H01L 27/0886 |
| 9,293,530 B1* | 3/2016 | Cheng | H01L 21/823431 |
| 9,318,606 B2* | 4/2016 | Wang | H01L 29/785 |
| 9,349,658 B1* | 5/2016 | Jacob | H01L 21/845 |
| 9,368,569 B1* | 6/2016 | Leobandung | H01L 29/66795 |
| 9,455,314 B1* | 9/2016 | Cheng | H01L 29/0638 |
| 9,466,690 B1* | 10/2016 | Balakrishnan | H01L 29/66522 |
| 9,613,956 B1* | 4/2017 | Belyansky | H01L 21/324 |
| 9,627,245 B2* | 4/2017 | Jacob | H01L 21/76224 |
| 9,716,046 B1* | 7/2017 | Cheng | H01L 21/845 |
| 9,793,395 B1* | 10/2017 | Liu | H01L 29/7827 |
| 9,799,676 B2* | 10/2017 | Xie | H01L 27/1211 |
| 2005/0056888 A1* | 3/2005 | Youn | H01L 21/823437 257/331 |
| 2005/0179030 A1* | 8/2005 | Seo | H01L 29/66795 257/20 |
| 2005/0250285 A1* | 11/2005 | Yoon | H01L 21/84 438/283 |
| 2006/0292781 A1* | 12/2006 | Lee | H01L 21/28282 438/197 |
| 2007/0072437 A1* | 3/2007 | Brennan | H01L 21/0338 438/761 |
| 2007/0082437 A1* | 4/2007 | Cheng | H01L 29/66795 438/197 |
| 2007/0114612 A1* | 5/2007 | Ahn | H01L 27/11 257/364 |
| 2007/0158756 A1* | 7/2007 | Dreeskornfeld | H01L 21/823412 257/374 |
| 2011/0021026 A1* | 1/2011 | Luning | H01L 21/3086 438/692 |
| 2011/0079836 A1* | 4/2011 | Lin | H01L 27/10826 257/306 |
| 2013/0181263 A1* | 7/2013 | Cai | H01L 29/66795 257/288 |
| 2013/0217204 A1* | 8/2013 | Park | H01L 21/823431 438/424 |
| 2014/0017889 A1* | 1/2014 | Lee | H01L 21/4846 438/674 |
| 2014/0117462 A1* | 5/2014 | Cheng | H01L 29/66803 257/410 |
| 2014/0124860 A1* | 5/2014 | Cheng | H01L 21/845 257/347 |
| 2014/0124863 A1* | 5/2014 | Cheng | H01L 21/845 257/350 |
| 2014/0175554 A1* | 6/2014 | Loubet | H01L 21/823431 257/368 |
| 2014/0197457 A1* | 7/2014 | Wang | H01L 29/785 257/192 |
| 2014/0225168 A1* | 8/2014 | Pham | H01L 29/66795 257/288 |
| 2014/0264600 A1* | 9/2014 | Adam | H01L 29/785 257/347 |
| 2014/0315371 A1* | 10/2014 | Cai | H01L 21/823821 438/424 |
| 2015/0021690 A1* | 1/2015 | Jacob | H01L 21/02532 257/347 |
| 2015/0056724 A1* | 2/2015 | Shieh | H01L 22/12 438/14 |
| 2015/0108572 A1* | 4/2015 | Cheng | H01L 27/1211 257/347 |
| 2015/0200128 A1* | 7/2015 | Jacob | H01L 21/76224 438/424 |
| 2015/0255555 A1* | 9/2015 | Xie | H01L 29/785 257/401 |
| 2016/0093619 A1* | 3/2016 | Cheng | H01L 27/0924 257/369 |
| 2016/0155670 A1* | 6/2016 | Liaw | H01L 21/823431 257/401 |
| 2016/0218105 A1* | 7/2016 | Lee | H01L 29/7856 |
| 2016/0225659 A1* | 8/2016 | Jacob | H01L 21/76213 |
| 2016/0225663 A1* | 8/2016 | Hyun | H01L 21/76879 |
| 2016/0225677 A1* | 8/2016 | Jacob | H01L 21/845 |
| 2016/0336347 A1* | 11/2016 | Cheng | H01L 27/1211 |
| 2016/0336428 A1* | 11/2016 | Cheng | H01L 29/66795 |
| 2016/0359043 A1* | 12/2016 | Chen | H01L 29/7851 |
| 2017/0213772 A1* | 7/2017 | Cheng | H01L 21/845 |
| 2017/0309647 A1* | 10/2017 | Basker | H01L 27/1211 |

* cited by examiner

SEMICONDUCTOR DEVICES AND METHODS FOR FORMING THE SAME

CROSS REFERENCE TO RELATED APPLICATIONS

This Application claims priority of Taiwan Patent Application No. 105137203, filed on Nov. 15, 2016, the entirety of which is incorporated by reference herein.

BACKGROUND OF THE INVENTION

Field of the Invention

The invention relates to semiconductor devices and in particular to fin field effect transistors (FinFET) using silicon-on-insulator (SOI) substrates and methods for forming the same.

Description of the Related Art

In the semiconductor device industry, the introduction of fin field effect transistors represented great progress. The three-dimensional (3D) configuration of fin field effect transistors exceeded the basic performance and efficiency of planar transistors. Fin field effect transistors have upright fin structures, which extend vertically upward from the substrates. The fin structures have channels inside of them, and there are gate structures located on the fin structures surrounding the channels so that the channel can be controlled by the gate structure from multiple directions. The fin field effect transistors have the advantages of decreased threshold voltage, reduced leakage current, and improved performance.

On the other hand, in recent years, the silicon-on-insulator technique has been widely used in the design of integrated circuits. Compared to traditional bulk semiconductor substrates, silicon-on-insulator substrates have several advantages due to the buried oxide layer therein. These advantages include, for example, the silicon-on-insulator substrates having resistance to latch-up, lower parasitic capacitance, faster operation speeds, higher radio resistance, less chance for soft errors to occur, and being less influenced by the short channel effect.

Although existing semiconductor devices and methods for forming the same in the development of fin field effect transistors and the application of silicon-on-insulator substrates have been adequate for their intended purposes, they have not been entirely satisfactory in all respects. Therefore, up to the present, there are still some problems that can be improved upon in semiconductor devices.

BRIEF SUMMARY OF THE INVENTION

Embodiments of the disclosure utilize the disposition of a first spacer to form the structure of silicon-on-insulator substrates, utilizing the technique of local oxidation of silicon (LOCOS) to form an oxide layer on a sidewall of a semiconductor substrate to prevent the substrate from being oxidized entirely. Moreover, embodiments of the disclosure include etching a portion of the semiconductor substrate with the disposition of a second spacer to form a precisely sized fin structure on the second oxide layer, such that the fin field effect transistors can easily reach a fully depleted state while voltage is applied to the gate. In addition, according to the embodiments of the disclosure, the fin structure is formed from a portion of the semiconductor substrate, and the material thereof may be single crystal silicon. Compared to fin structures of the past made of polysilicon by deposition and annealing, the advantage of the fin structures of the disclosure is that they have a higher current on/off ratio ($I_{on}/I_{off}$).

Some embodiments of the disclosure provide a method for forming a semiconductor device. The method includes forming a first nitride layer on a semiconductor substrate, and forming a first oxide layer on the first nitride layer. In addition, the method includes forming a first trench through the first oxide layer, the first nitride layer and a portion of the semiconductor substrate. The method also includes forming a first spacer on a sidewall of the first trench, and forming a second trench in the semiconductor substrate by using the first spacer as a mask. The method further includes removing the first oxide layer to form a third trench. The method also includes forming a second oxide layer in the second trench, wherein the second oxide layer laterally extends into the semiconductor substrate and under the first spacer. In addition, the method includes forming a second spacer on a sidewall of the third trench, and removing a portion of the first nitride layer and another portion of the semiconductor substrate by etching and using the second spacer as a mask to form a fin structure on the second oxide layer.

Some embodiments of the disclosure provide a semiconductor device. The semiconductor device includes a second oxide layer disposed in a semiconductor substrate and adjacent to a surface of the semiconductor substrate. The semiconductor device also includes a fin structure disposed on the second oxide layer. The semiconductor device further includes a gate dielectric layer disposed on the fin structure, the semiconductor substrate and the second oxide layer, and a gate electrode layer disposed on the gate dielectric layer.

A detailed description is given in the following embodiments with reference to the accompanying drawings.

BRIEF DESCRIPTION OF THE DRAWINGS

The disclosure can be more fully understood from the following detailed description when read with the accompanying figures. It is worth noting that, in accordance with the standard practice in the industry, various features are not drawn to scale. In fact, the dimensions of the various features may be arbitrarily increased or reduced for clarity of discussion.

FIGS. 1A to 1L are cross-sectional views illustrating an exemplary sequential forming process of a semiconductor device in accordance with some embodiments.

DETAILED DESCRIPTION OF THE INVENTION

The following disclosure provides many different embodiments, or examples, for implementing different features of the semiconductor devices provided. Specific examples of components and arrangements are described below to simplify the present disclosure. These are, of course, merely examples and are not intended to be limiting. For example, the formation of a first component over or on a second component in the description that follows may include embodiments in which the first and second components are formed in direct contact, and may also include embodiments in which additional components may be formed between the first and second components, such that the first and second components may not be in direct contact. In addition, the present disclosure may repeat reference numerals and/or letters in the various embodiments. This repetition is for the purpose of simplicity and clarity and does not in itself dictate a relationship between the various embodiments and/or configurations discussed.

Some embodiments are described below. Throughout the various figures and illustrative embodiments, like reference numbers are used to designate like elements. It should be understood that additional operations can be provided before, during, and after the method, and some of the operations described can be replaced or eliminated for other embodiments of the method.

Embodiments of the disclosure utilize the disposition of a first spacer to form a second oxide layer in a semiconductor substrate, and utilize the disposition of a second spacer to etch a portion of the semiconductor substrate and to form a fin structure with its height and width in a range from about 20 nm to about 250 nm on the second oxide layer. The fin structure is formed by the semiconductor substrate, and the material of the fin structure may be single crystal silicon. The methods for forming a semiconductor device provided in the embodiments of the disclosure has the advantages of a silicon-on-insulator substrate, and a precisely sized fin structure can be produced, such that fin field effect transistors which can easily reach a fully depleted state are produced. In addition, a fin structure of single crystal silicon can be made by the embodiments of the disclosure, so that the current on/off ratio of the semiconductor devices can be increased.

Embodiments for forming a semiconductor device are provided. FIGS. 1A to 1L are cross-sectional views illustrating an exemplary sequential forming process of a semiconductor device 100a in accordance with some embodiments.

Figure 1A:
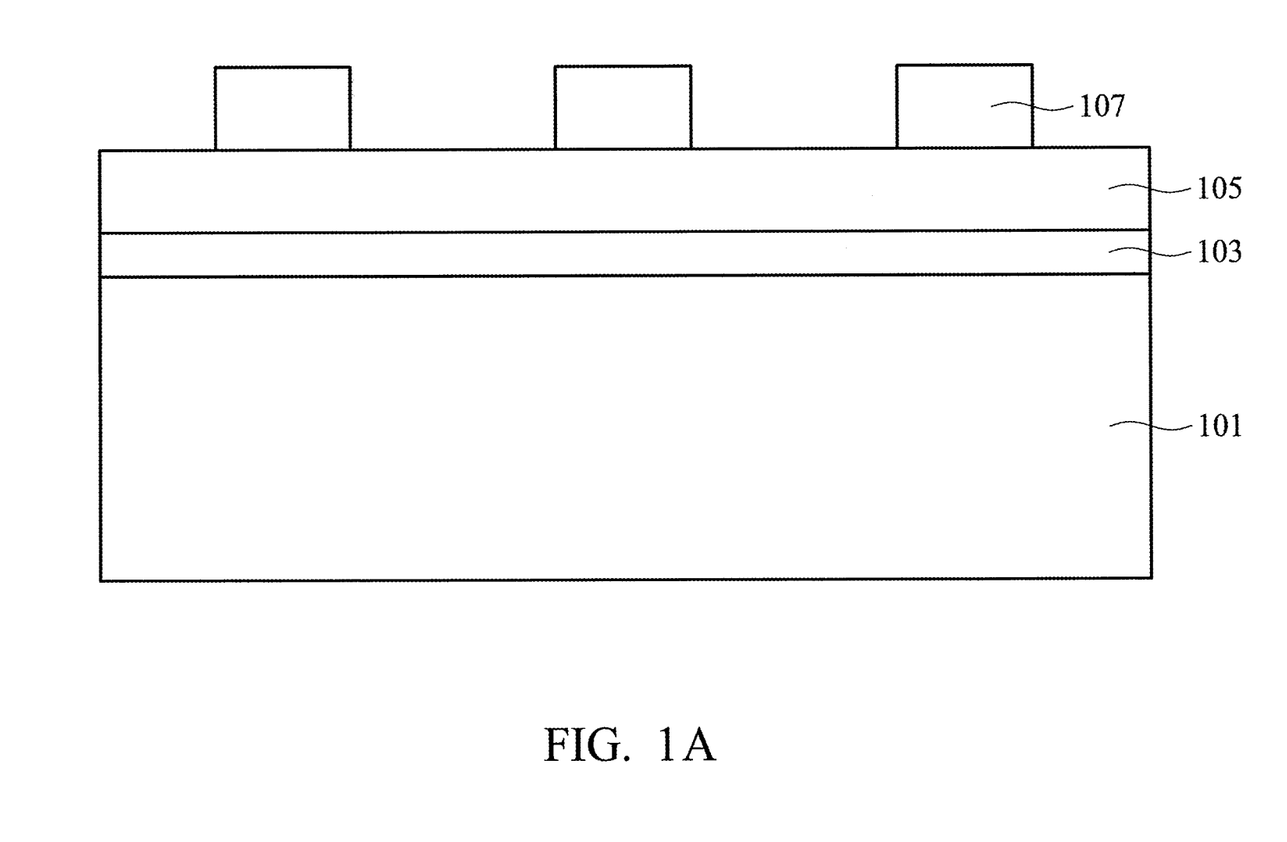

As shown in FIG. 1A, a semiconductor substrate 101 is provided, in accordance with some embodiments. In some embodiments, the semiconductor substrate 101 may be made of single crystal silicon, polysilicon or other semiconductor materials. Alternatively, the semiconductor substrate 101 may include other elementary semiconductor materials such as germanium (Ge). In some embodiments, the semiconductor substrate 101 is made of a compound semiconductor such as silicon carbide, gallium nitride, gallium arsenide, indium arsenide, or indium phosphide. In some embodiments, the semiconductor substrate 101 is made of an alloy semiconductor such as silicon germanium, silicon germanium carbide, gallium arsenic phosphide, or gallium indium phosphide. In some embodiments, the semiconductor substrate 101 includes an epitaxial layer. For example, the semiconductor substrate 101 has an epitaxial layer covering a bulk semiconductor. In some embodiments, the semiconductor substrate 101 is a lightly doped p-type or n-type substrate. In some embodiments, a pad oxide layer may be formed on the semiconductor substrate 101, and n-type or p-type dopants may be implanted in applicable areas.

Next, as shown in FIG. 1A, a first nitride layer 103 is formed on the semiconductor substrate 101, a first oxide layer 105 is formed on the first nitride layer 103, and a patterned photo resist layer 107 is formed on the first oxide layer 105. In some embodiments, the first nitride layer 103 is made of silicon nitride, and the first oxide layer 105 is made of silicon dioxide. In some embodiments, the first nitride layer 103 and the first oxide layer 105 are formed respectively by using chemical vapor deposition (CVD), atomic layer deposition (ALD), spin coating, or a combination thereof.

Figure 1B:
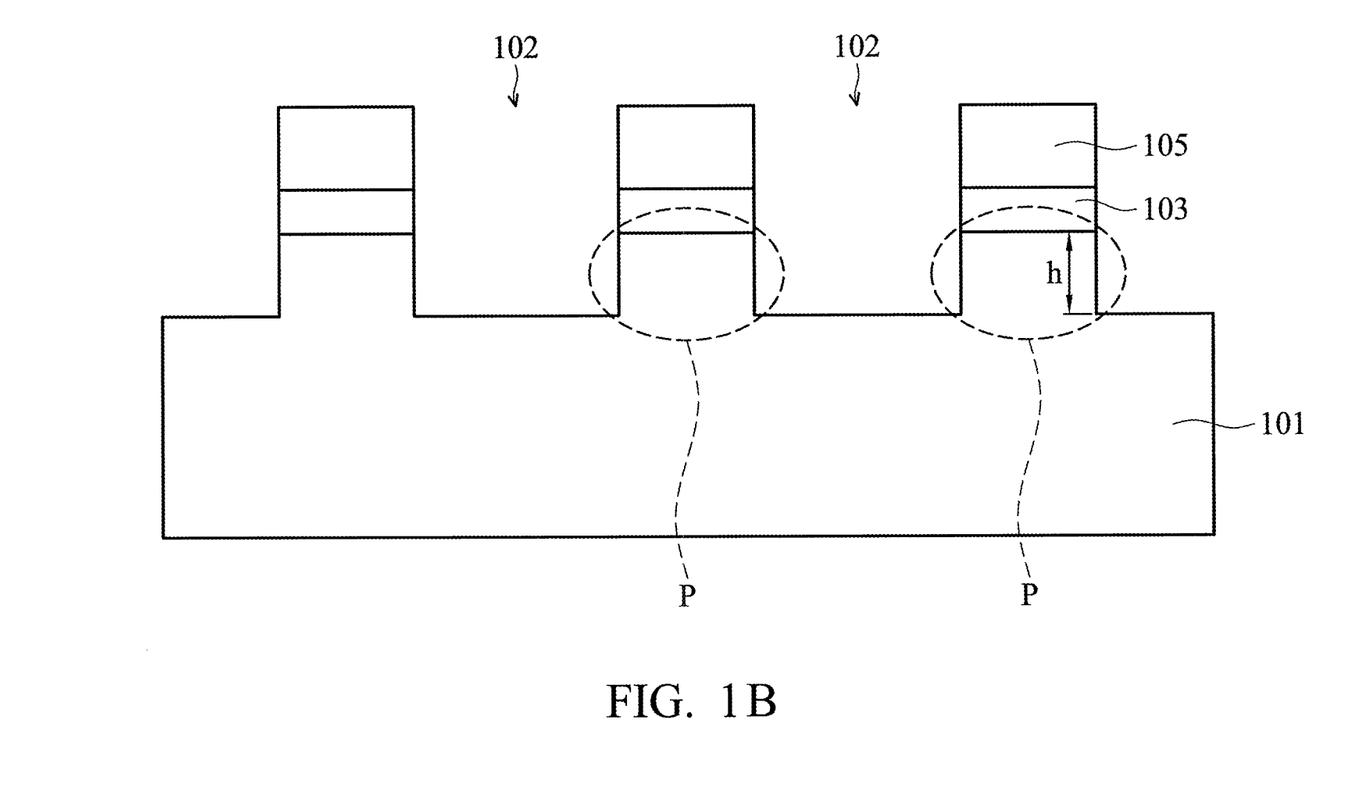

As shown in FIG. 1B, the first oxide layer 105, the first nitride layer 103 and a portion of the semiconductor substrate 101 are patterned by using the patterned photo resist layer 107 as a mask to form first trenches 102 and semiconductor substrate patterns P, in accordance with some embodiments. In some embodiments, the first trenches 102 penetrate through the first oxide layer 105, the first nitride layer 103 and a portion of the semiconductor substrate 101. In some embodiments, the height h of the semiconductor substrate patterns P is in a range from about 20 nm to about 250 nm. In some embodiments, the height h of the semiconductor substrate patterns P is in a range from about 100 nm to about 200 nm. The height h of the semiconductor substrate patterns P is considered as the height of the fin structures F (as shown in FIG. 1J) formed in the following processes.

Figure 1C:
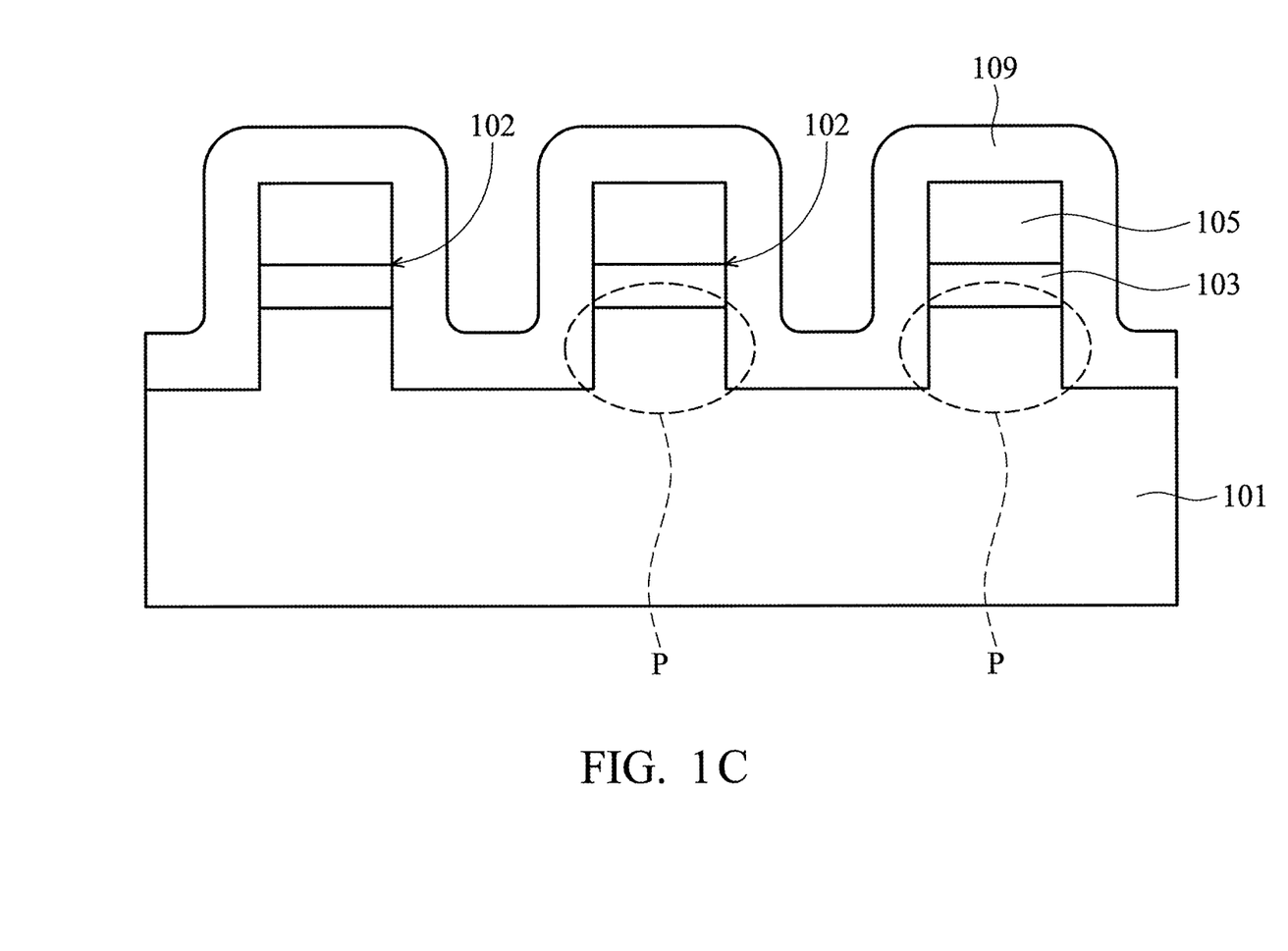

As shown in FIG. 1C, a second nitride layer 109 is formed conformally on sidewalls and bottom surfaces of the first trenches 102, and on the first oxide layer 105. In other words, the second nitride layer 109 is formed on the surface of the semiconductor substrate 101, on the sidewalls of the semiconductor substrate patterns P, on the sidewall of the first nitride layer 103 and on the sidewall and the top surface of the first oxide layer 105. In some embodiments, the second nitride layer 109 is made of silicon nitride. In some embodiments, the second nitride layer 109 is formed by using chemical vapor deposition, low-pressure chemical vapor deposition (LPCVD), plasma enhanced chemical vapor deposition (PECVD), atomic layer deposition, spin coating, sputtering, or a combination thereof.

Figure 1D:
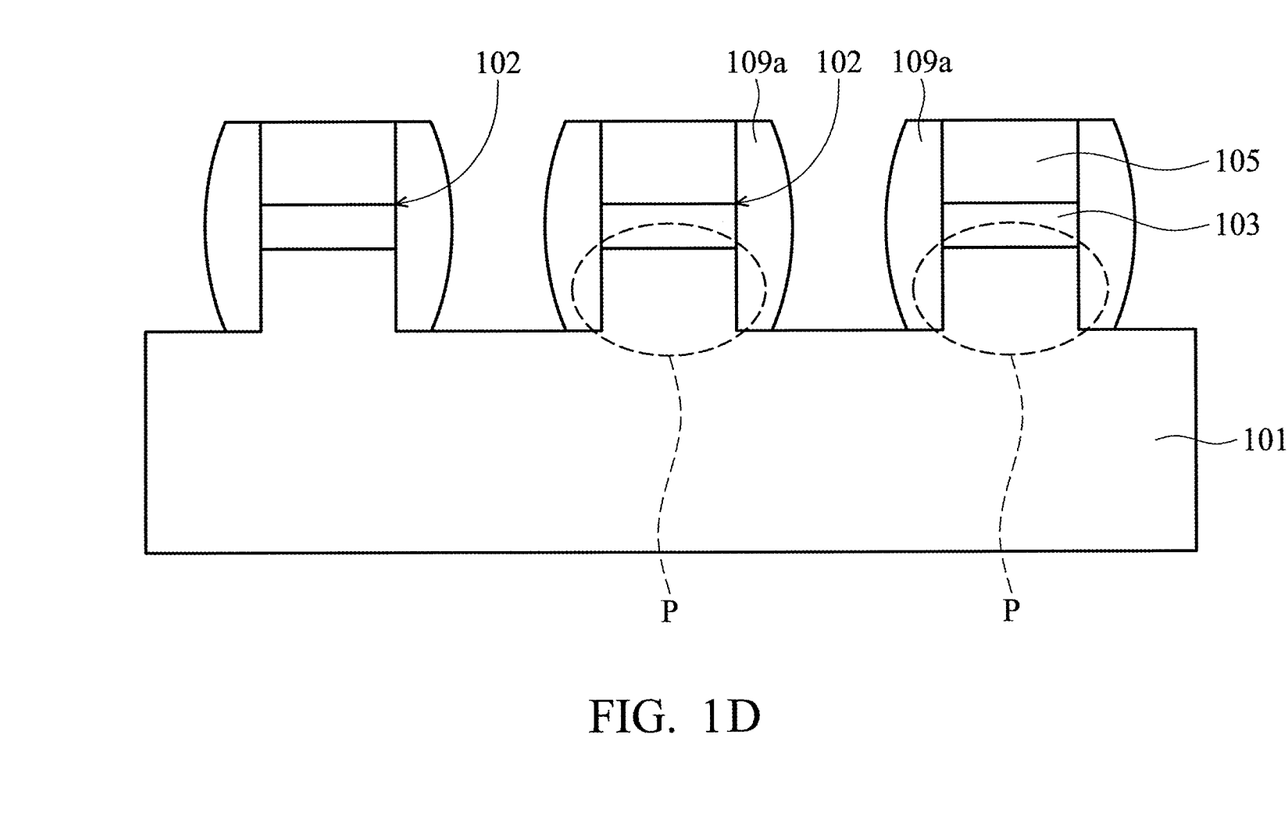

As shown in FIG. 1D, the portion of the second nitride layer 109 on the bottoms of the first trenches 102 and on the first oxide layer 105 are removed by anisotropic etching (such as dry etching) to form first spacers 109a. In other words, the portions of the second nitride layer 109 on the surface of the semiconductor substrate 101 and on the top surface of the first oxide layer 105 are removed by anisotropic etching to form the first spacers 109a on the sidewalls of the first trench 102. As shown in FIG. 1D, the first spacers 109a are disposed on the sidewalls of the semiconductor substrate patterns P, on the sidewalls of the first nitride layer 103 and on the sidewalls of the first oxide layer 105, and the first spacers 109a contact a portion of the semiconductor substrate 101. It should be noted that the purpose of disposing the first spacers 109a is to define the positions of the second oxide layers 111a, 111b, 111c and 111d (as shown in FIG. 1G) in the following processes. The second oxide layers 111a, 111b, 111c and 111d are considered as the buried oxide layer of the silicon-on-insulator (SOI) substrate.

Figure 1E:
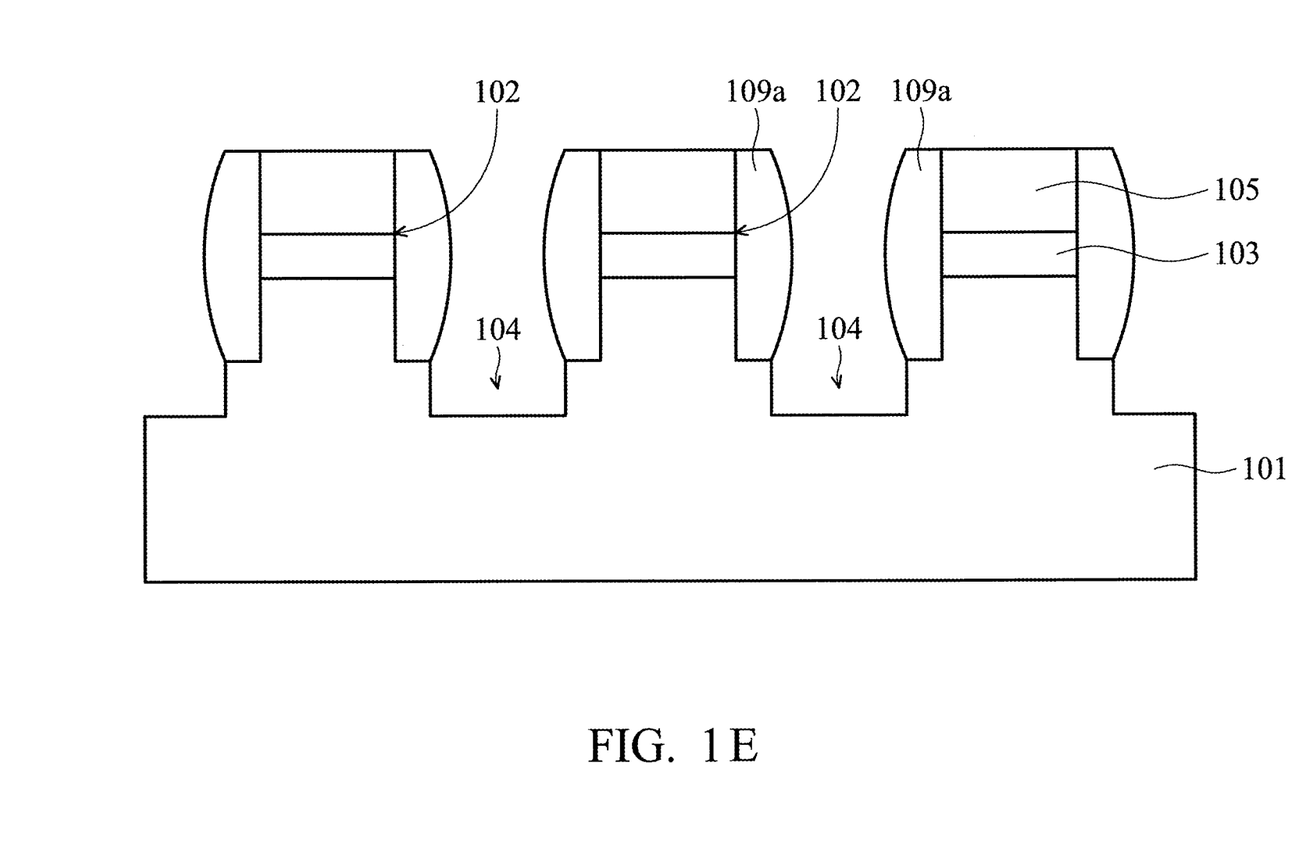

As shown in FIG. 1E, an etching process is performed to form second trenches 104 in the semiconductor substrate 101 by using the first spacers 109a as a mask. The second trenches 104 are formed under the first trenches 102, and the widths and depths of the second trenches 104 are less than those of the first trenches 102. In some embodiments, the second trenches 104 are formed by anisotropic etching (such as dry etching). As shown in FIG. 1E, after forming the second trenches 104, the semiconductor substrate 101 has a step-like cross-sectional profile due to the widths of the second trenches 104 being less than the widths of the first trenches 102.

Figure 1F:
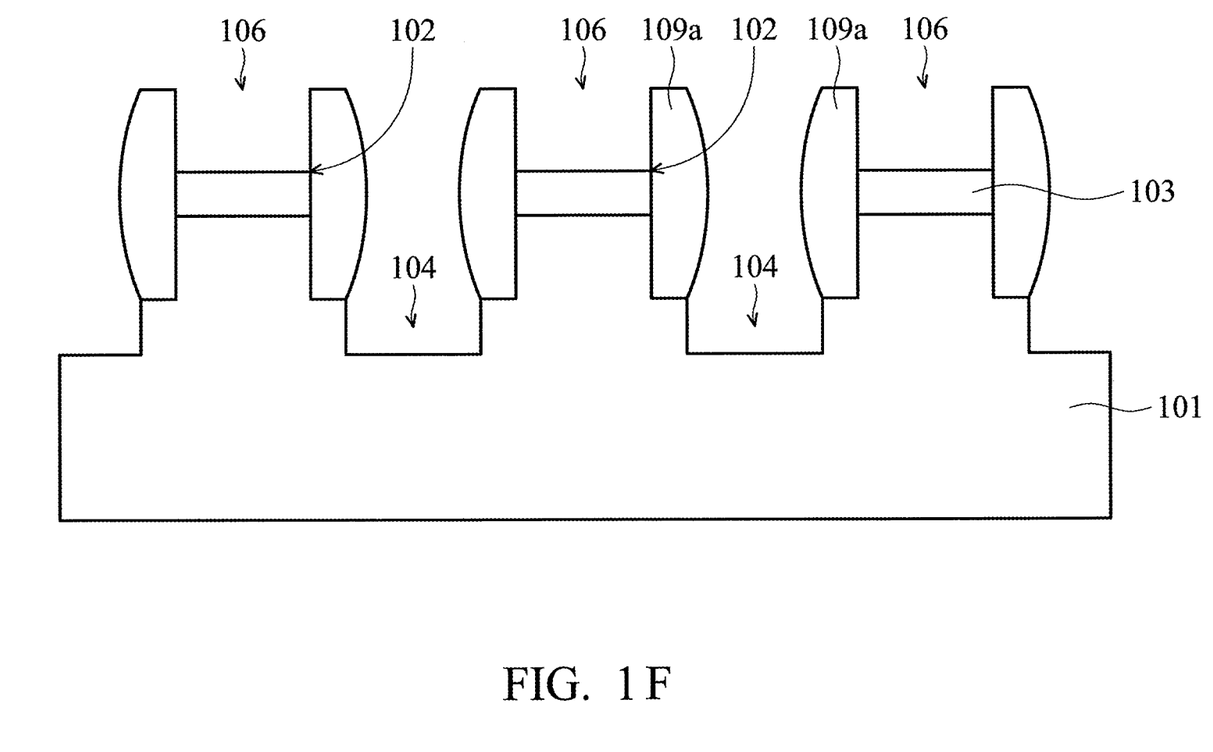
Figure 1G:
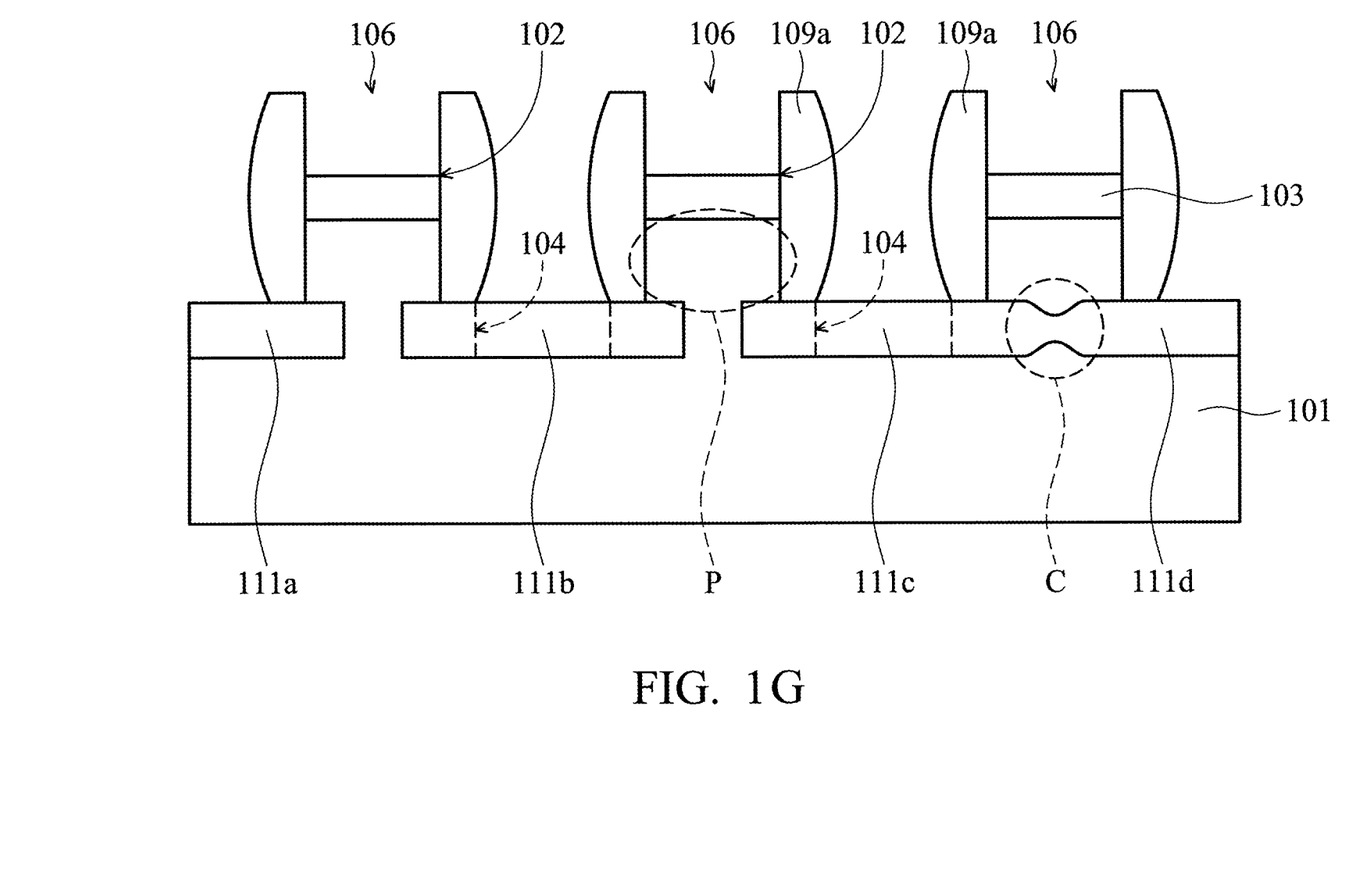

Next, as shown in FIG. 1F, the first oxide layer 105 is removed to form third trenches 106. In some embodiments, by covering the areas outside of the areas of the fin structures with a patterned photo resist layer (not shown), an etching process is performed to remove the first oxide layer 105 in the areas of the fin structures, which are not covered by the patterned photo resist layer. Since FIG. 1F is a cross-sectional view along the areas of the fin structures, the first oxide layer 105 is removed and is not shown in FIG. 1F, and the third trenches 106 are formed. In other words, the positions of the third trenches 106 are considered as the places where the original first oxide layer 105 is located. Therefore, the bottom surface of the third trenches 106 are the top surface of the first nitride layer 103, and the first spacers 190a are disposed at both sides of each of the third trenches 106.

As shown in FIG. 1G, multiple second oxide layers 111a, 111b, 111c and 111d are formed, each of which is located in the respective second trench 104, and the second oxide layers 111a, 111b, 111c and 111d are further laterally extended into the semiconductor substrate 101, located under the first spacers 109a and under portions of the semiconductor substrate patterns P, in accordance with some embodiments. As shown in FIG. 1G, the second oxide layers 111a, 111b, 111c and 111d are disposed in the semiconductor substrate 101 and adjacent to the surface of the semiconductor substrate 101. In some embodiments, the second oxide layers 111a, 111b, 111c and 111d are formed by thermal oxidation. In some embodiments, the second oxide layers 111a, 111b and 111c are not connected to each other, and the second oxide layers 111c and 111d are connected by a connecting portion C.

It should be noted that the surfaces of the second oxide layers 111a, 111b, 111c and 111d which are formed by thermal oxidation may not be smooth, and the speeds and states of the formation of the second oxide layers 111a, 111b, 111c and 111d may be different from each other, wherein the connecting portion C is the portion of the second oxide layer 111c connected to the second oxide layer 111d because of their lateral overgrowth. In some embodiments, the speed of formation of each second oxide layer 111a, 111b, 111c and 111d may be modulated, such that the lateral growing distances of the second oxide layers 111a, 111b, 111c and 111d beyond the third trenches 106 may be more than about 250 nm. In some embodiments, the lateral growing distances of the second oxide layers 111a, 111b, 111c and 111d beyond the third trenches 106 may be more than about 500 nm, so that the fin structures F (as shown in FIG. 1J) formed in the subsequent processes can be located exactly above the second oxide layers 111a, 111b, 111c and 111d.

In the embodiments of the disclosure, the purpose of disposing the second oxide layers 111a, 111b, 111c and 111d is the same as that of the buried oxide layer in the silicon-on-insulator substrate. The difference is that the second oxide layers 111a, 111b, 111c and 111d are formed by thermal oxidation, whereas in the past, the buried oxide layer was formed by oxygen ion implantation. Some embodiments of the disclosure can avoid the problem of surface defects forming in the silicon-on-insulator substrate which are caused by oxygen ion implanting. In some embodiments, the surfaces of the second oxide layers 111a, 111b, 111c and 111d formed by thermal oxidation are not coplanar.

Figure 1H:
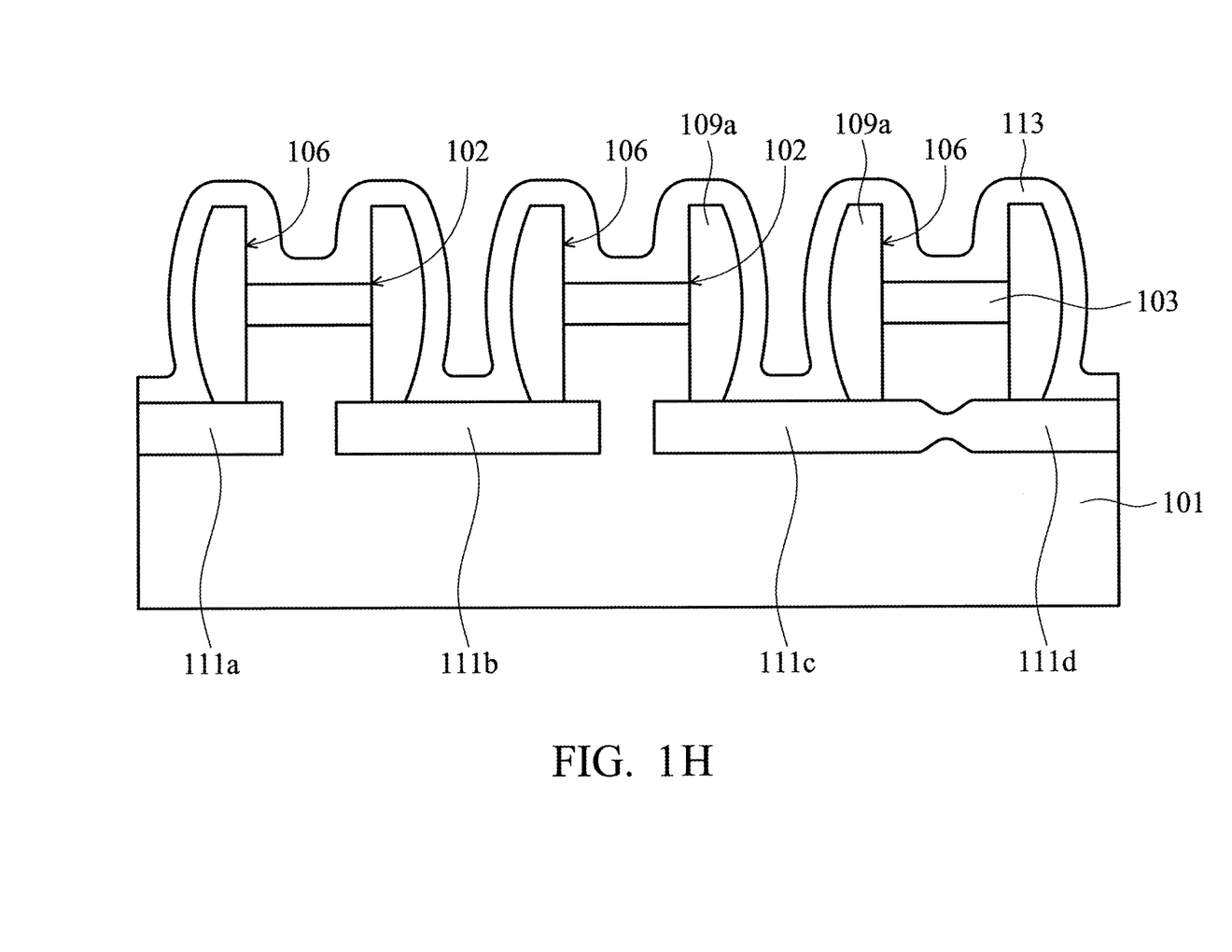

As shown in FIG. 1H, a third oxide layer 113 is formed conformally on the bottoms and the sidewalls of the third trenches 106, on the tops and the sidewalls of the first spacers 109a, and on the second oxide layers 111a, 111b, 111c and 111d, in accordance with some embodiments. In other words, the third oxide layer 113 is formed on the first nitride layer 103, on the tops and the sidewalls of the first spacers 109a, and on a portion of the bottom surfaces of the first trenches 102. In some embodiments, the third oxide layer 113 is made of silicon oxide.

Figure 1I:
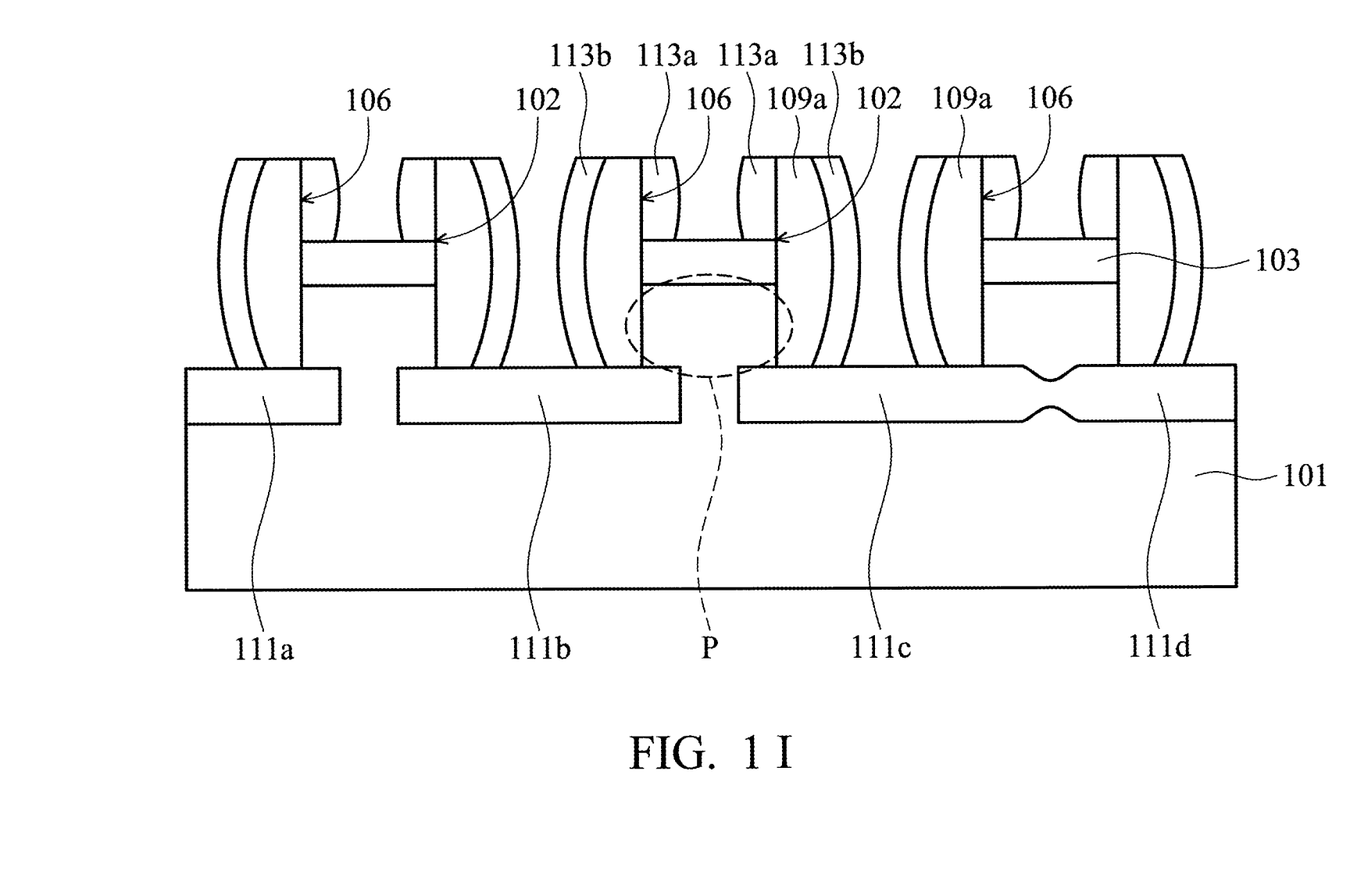
Figure 1J:
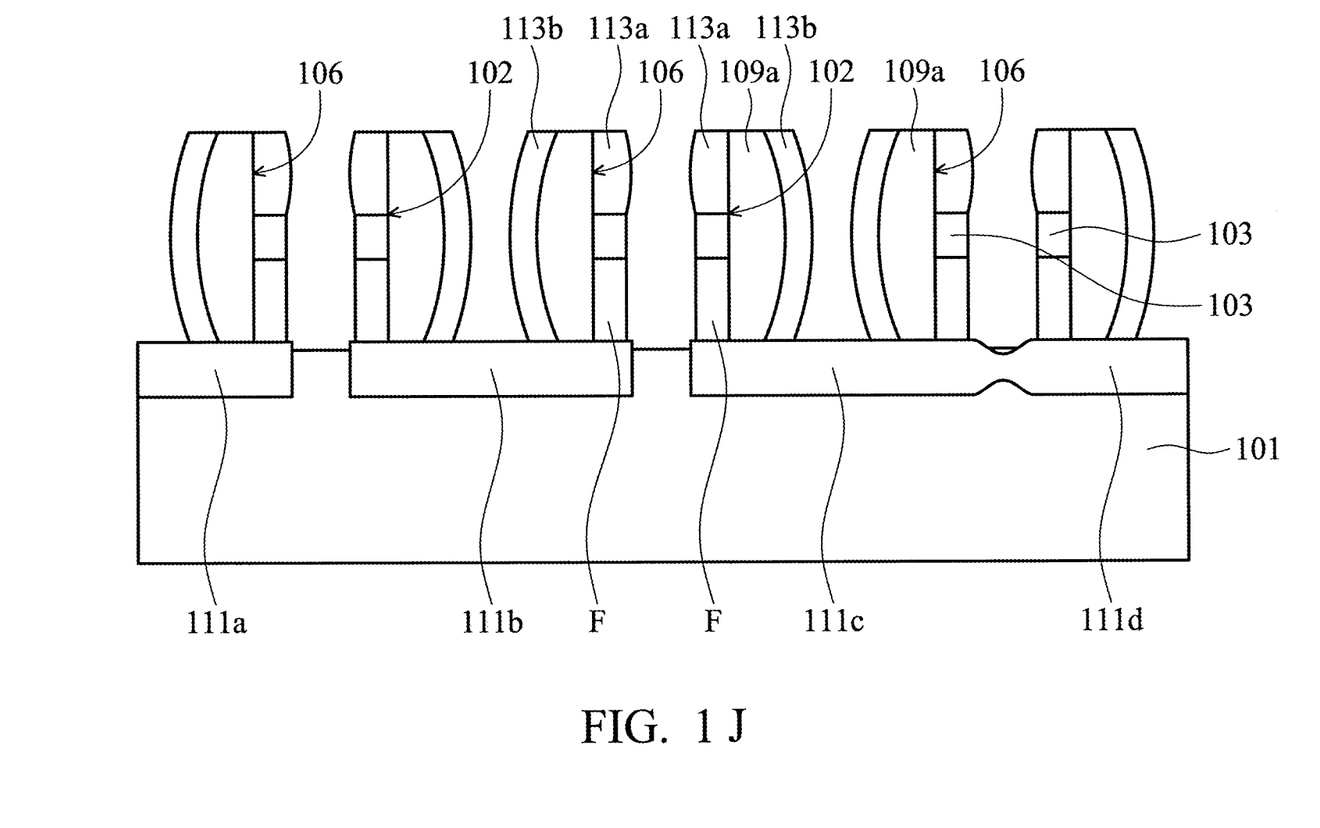

Then, as shown in FIG. 1I, the portions of the third oxide layer 113 on the bottoms of the third trenches 106, on the tops of the first spacers 109a and on the second oxide layers 111a, 111b, 111c and 111d are removed by anisotropic etching (such as dry etching) to form second spacers 113a and 113b, in accordance with some embodiments. In other words, the third oxide layer 113 on the first nitride layer 103, on the tops of the first spacers 109a, and on the bottom surfaces of the first trenches 102 is removed by anisotropic etching to form the second spacer 113a on the sidewalls of the third trenches 106, and to form the second spacer 113b on the sidewalls of the first spacers 109a in the first trenches 102. In other words, the second spacers 113a and 113b are located at both sides of each of the first spacers 109a respectively, and located on the sidewalls of the third trenches 106 and on the sidewalls of the first spacers 109a in the first trenches 102 respectively. In some embodiments, since the second spacers 113a are located on the first nitride layer 103 and the semiconductor substrate patterns P which protrude from the surface of the semiconductor substrate 101, the heights of the second spacers 113a are less than the heights of the second spacers 113b.

Next, as shown in FIG. 1J, a portion of the first nitride layer 103 and a portion of the semiconductor substrate patterns P are removed by etching and using the second spacers 113a as a mask to form multiple fin structures F on the second oxide layers 111a, 111b, 111c and 111d, wherein each of the second oxide layers 111a, 111b, 111c and 111d has at least two fin structures F formed thereon. It should be noted that the fin structures F are formed by removing a portion of the semiconductor substrate patterns P by anisotropic etching (such as dry etching) until the second oxide layers 111a, 111b, 111c and 111d are exposed. This can ensure that the fin structures F are not connected to each other.

Figure 1K:
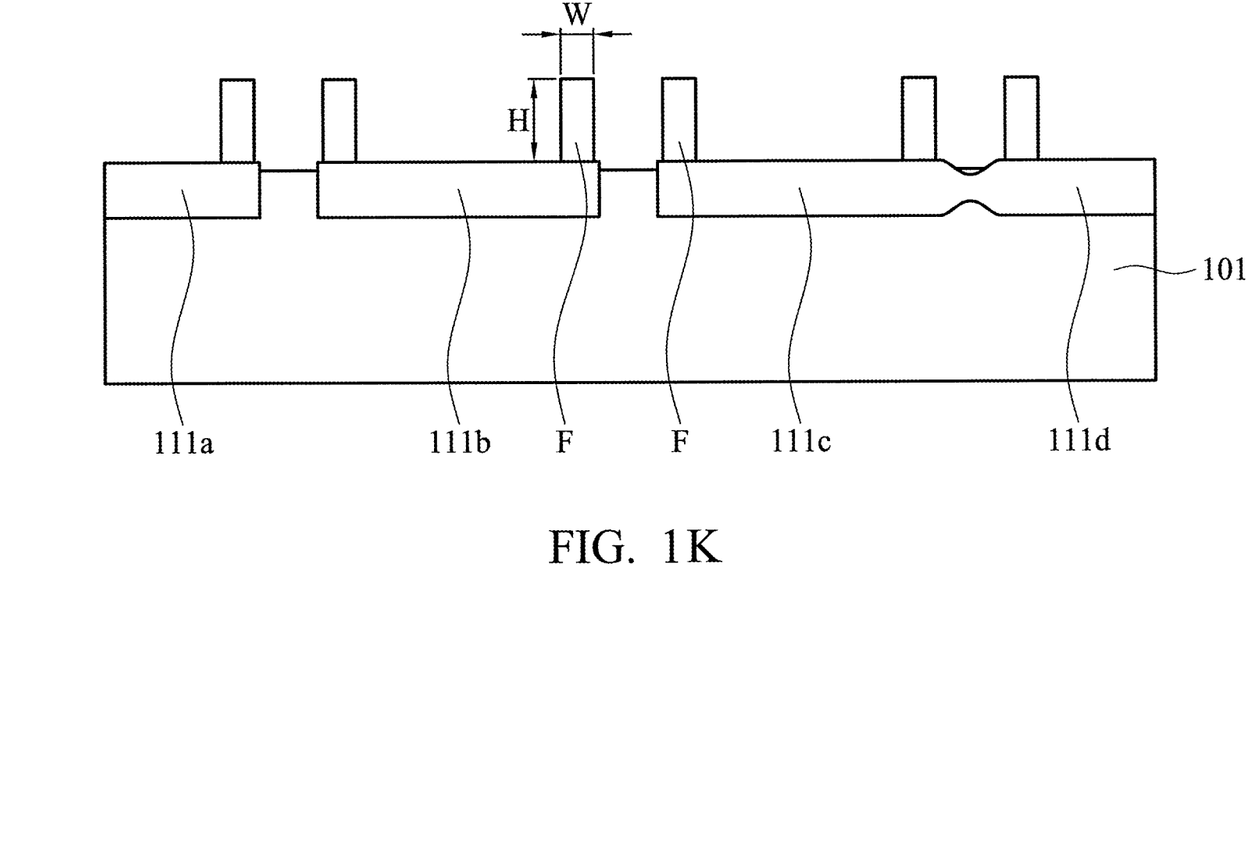

As shown in FIG. 1K, the first spacers 109a, the second spacers 113a and 113b, and the first nitride layer 103 are removed to entirely expose the fin structures F, in accordance with some embodiments. As mentioned above, the heights H of the fin structures F are considered as the heights h of the semiconductor substrate patterns P in FIG. 1B. In some embodiments, the heights H and the widths W of the fin structures F are in a range from about 20 nm to about 250 nm. In some embodiments, the heights H and the widths W of the fin structures F are in a range from about 100 nm to about 200 nm.

In some embodiments, the fin structures F are formed by etching the semiconductor substrate patterns P of the semiconductor substrate 101. Therefore, the material of the fin structures F is the same as the material of the semiconductor substrate 101, and the material of the fin structures F may be single crystal silicon. Compared to fin structures having been made of polysilicon by deposition and annealing in the past, the advantage of the fin structures of the embodiments of the disclosure being made of single crystal silicon is that they have a higher current on/off ratio (Ion/Ioff). From the other point of view, etching a portion of the semiconductor substrate patterns P by the disposition of the second spacers 113a and 113b can form precisely sized fin structures F on the second oxide layers 111a, 111b, 111c and 111d, so that the use of expensive equipment during the processes can be avoided, and the cost of the processes can be decreased.

Figure 1L:
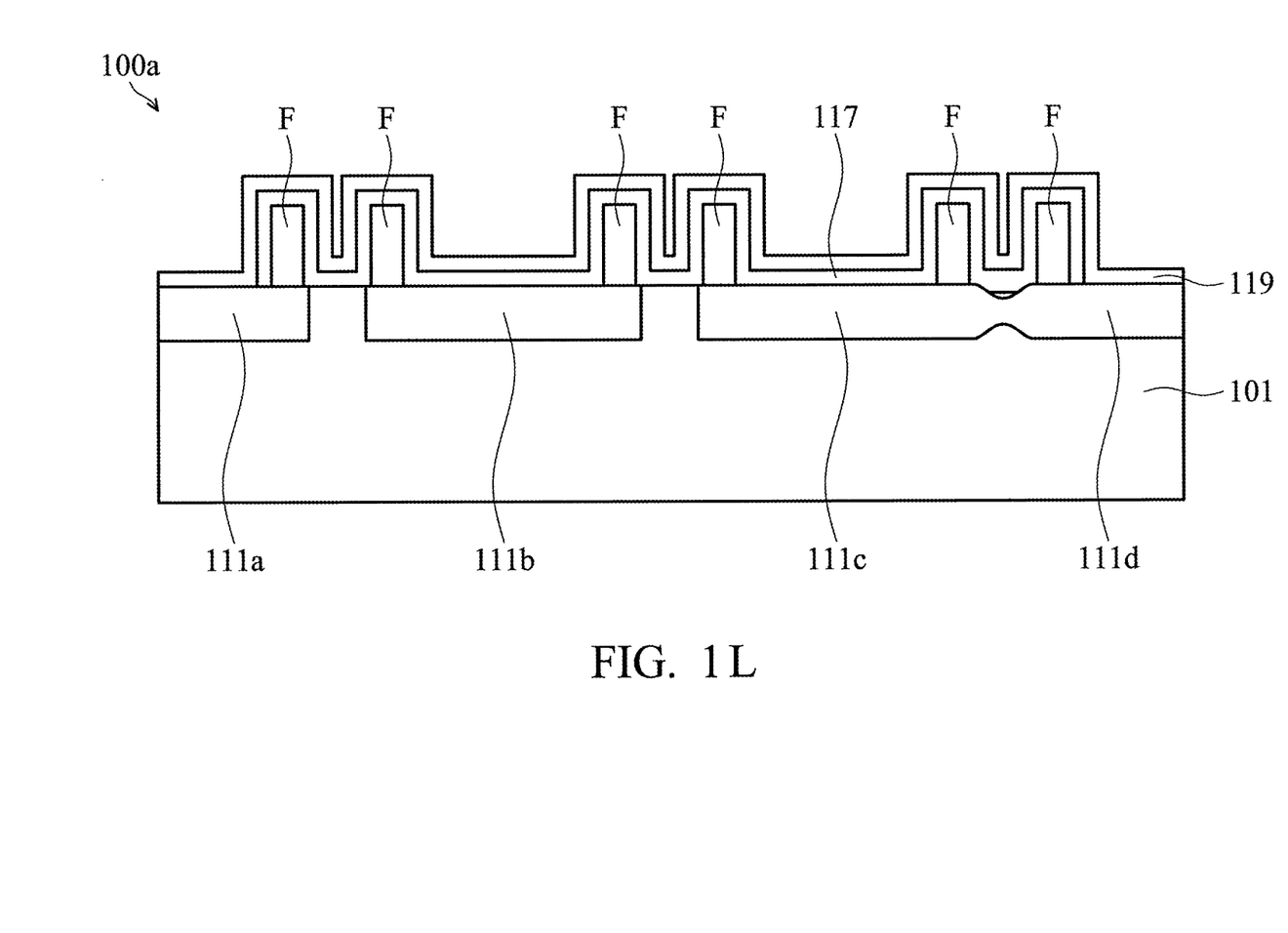
FIG. 1L is an exemplary cross-sectional view of a semiconductor device along line A-A' of FIG. 2 in accordance with some embodiments.

As shown in FIG. 1L, a gate dielectric layer 117 is formed on the fin structures F, semiconductor substrate 101, and the second oxide layers 111a, 111b, 111c and 111d, and a gate electrode layer 119 is formed on the gate dielectric layer 117, in accordance with some embodiments. In some embodiments, the gate dielectric layer 117 is formed by using thermal oxidation, chemical vapor deposition (CVD), flowable chemical vapor deposition (FCVD), atomic layer deposition (ALD), low-pressure chemical vapor deposition (LPCVD), plasma enhanced chemical vapor deposition (PECVD), another applicable process, or a combination thereof. The gate electrode layer 119 is formed by chemical vapor deposition (CVD), atomic layer deposition (ALD), low-pressure chemical vapor deposition (LPCVD), plasma enhanced chemical vapor deposition (PECVD), another applicable process, or a combination thereof.

In some embodiments, the gate dielectric layer 117 may be formed by silicon oxide or a high-K dielectric material, wherein the high-K dielectric material may be formed by hafnium oxide, zirconium oxide, aluminum oxide, hafnium dioxide-alumina alloy, hafnium silicon oxide, hafnium silicon oxynitride, hafnium tantalum oxide, hafnium titanium oxide, hafnium zirconium oxide, another suitable high-K material, or a combination thereof. In some embodiments, the gate electrode layer 119 may include metal or another applicable conductive material such as tungsten (W), copper (Cu), nickel (Ni), aluminum (Al), tungsten silicide (WSi), polysilicon, or a combination thereof. In some embodiments, after forming the gate dielectric layer 117 and the gate electrode layer 119, n-type or p-type doped areas are formed as source/drain (S/D) regions in appropriate areas of the fin structures F, and metal contacts (not shown) of the source/drain regions are formed to complete the formation of the fin field effect transistors of the semiconductor device 100a.

Figure 2:
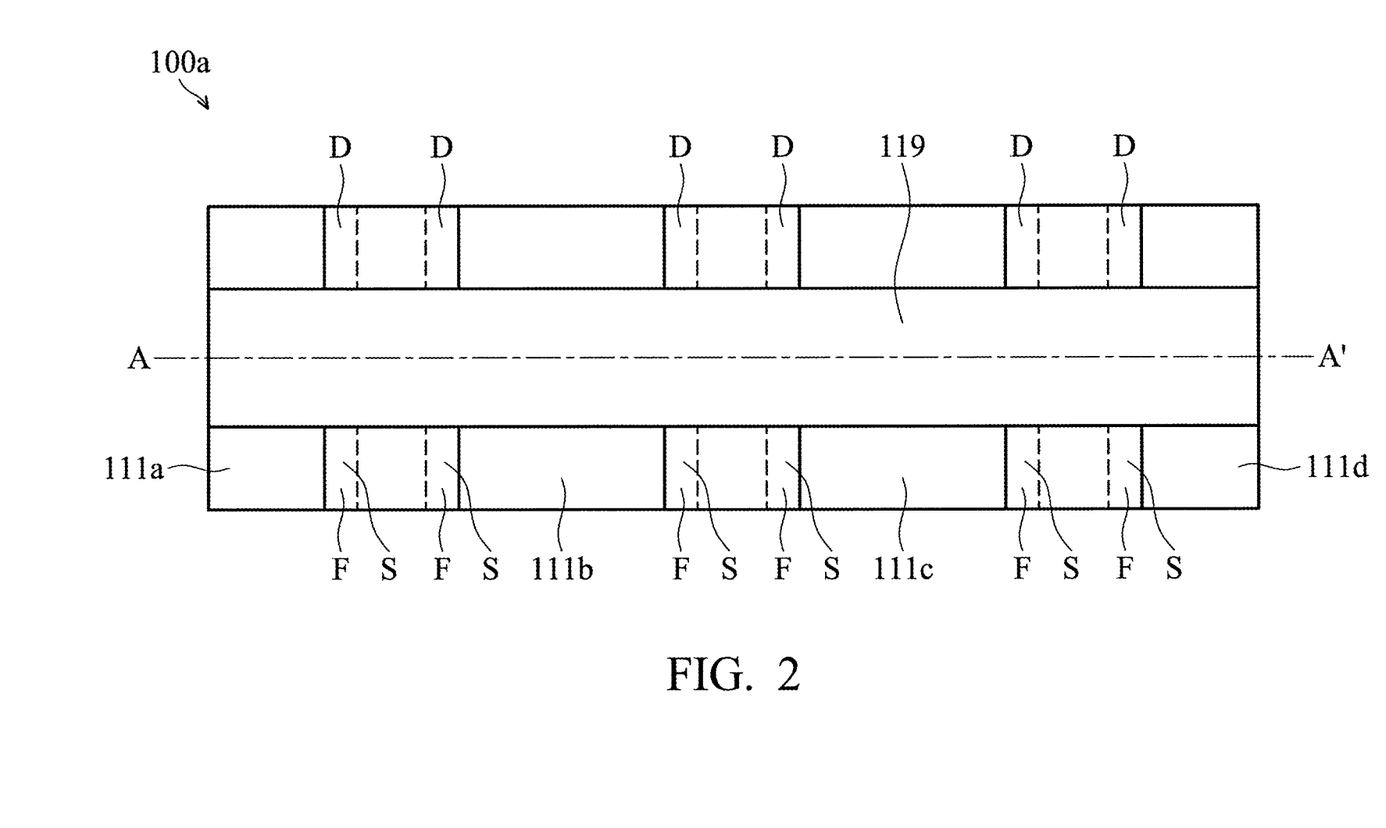
FIG. 2 is a top view of a portion of a semiconductor device in accordance with some embodiments.

FIG. 2 is a top view of a portion of a semiconductor device 100a in accordance with other embodiments. FIG. 1L is an exemplary cross-sectional view of the semiconductor device 100a along line A-A' of FIG. 2 in accordance with some embodiments.

As shown in FIG. 2, the gate structure (including the gate dielectric layer 117 and the gate electrode layer 119) is disposed on the fin structures F and surrounds the channel region inside the fin structures F so that the channel region can be controlled by the gate structure from multiple directions, in accordance with some embodiments. In addition, the two ends of the fin structures F at the two sides of the gate structure are respective source regions S and drain regions D.

The above-mentioned embodiments provide a semiconductor device 100a and a method for forming the same. The semiconductor device 100a is a fin field effect transistor using a silicon-on-insulator substrate. In order to reach a state of full depletion of the FinFET while voltage is applied to the gate, the width or depth of the channel of the FinFET must be in a range from about 20 nm to about 250 nm. However, the formation of a fin field effect transistor with a width or depth of fin structures below 250 nm may incur a high processing cost (such as by requiring the use of expensive precision exposure equipment). On the other hand, although silicon-on-insulator substrates have advantages over bulk substrates, surface defects may be produced easily on the silicon-on-insulator substrates during the oxygen ion implantation process used for forming the buried oxide layers. Moreover, neutral zones in which charges accumulate may be produced in silicon-on-insulator substrates, and the floating-body effect may occur, such that the threshold voltages of the fin field effect transistors may fluctuate, which makes circuit design difficult.

In order to solve the aforementioned problems, the embodiments of the disclosure utilize the disposition of the first spacers to form the second oxide layers in the semiconductor substrate. As a result, the silicon-on-insulator substrate used for the semiconductor device is formed, which can avoid the surface of the semiconductor substrate being damaged by the bombardment of oxygen ions in the process of forming SOI substrates. Moreover, the embodiments of the disclosure utilize the disposition of the second spacers to etch a portion of the semiconductor substrate and to form fine sized fin structures on the second oxide layers, such that the fin field effect transistors can easily reach a fully depleted state while voltage is applied to the gate. Also, since the material of the fin structures may be the same as that of the semiconductor substrate, such as single crystal silicon, the advantage that the fin structures of the embodiments of the disclosure which are made of single crystal silicon have over fin structures of the past which were made of polysilicon by deposition and annealing, is that they have a higher current on/off ratio.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device, comprising:
    forming a first nitride layer on a semiconductor substrate;
    forming a first oxide layer on the first nitride layer;
    forming a first trench through the first oxide layer, the first nitride layer and a portion of the semiconductor substrate;
    forming a first spacer on a sidewall of the first trench;
    forming a second trench in the semiconductor substrate by using the first spacer as a mask;
    removing the first oxide layer to form a third trench;
    forming a second oxide layer in the second trench, wherein the second oxide layer laterally extends into the semiconductor substrate and under the first spacer;
    forming a second spacer on a sidewall of the third trench; and
    removing a portion of the first nitride layer and another portion of the semiconductor substrate by etching and using the second spacer as a mask to form a fin structure on the second oxide layer.

2. The method as claimed in claim 1, further comprising:
    after removing the portion of the first nitride layer and the portion of the semiconductor substrate by etching, removing the first spacer, the second spacer and the first nitride layer to expose the fin structure;
    forming a gate dielectric layer on the fin structure, the semiconductor substrate and the second oxide layer; and
    forming a gate electrode layer on the gate dielectric layer.

3. The method as claimed in claim 1, wherein forming the first spacer comprises:
    forming a second nitride layer on a sidewall and a bottom of the first trench, and on the first oxide layer; and removing the second nitride layer on the bottom of the first trench and on the first oxide layer by anisotropic etching.

4. The method as claimed in claim 1, wherein forming the second spacer comprises:

forming a third oxide layer on a sidewall and a bottom of the third trench, on a sidewall and a top of the first spacer, and on the second oxide layer; and removing the third oxide layer on the bottom of the third trench, on the top of the first spacer, and on the second oxide layer by anisotropic etching.

5. The method as claimed in claim 4, wherein the second spacer is further formed on the sidewall of the first spacer in the first trench.

6. The method as claimed in claim 1, wherein the second oxide layer is formed by thermal oxidation, and the second oxide layer is connected to another adjacent second oxide layer.

7. The method as claimed in claim 1, wherein the other portion of the semiconductor substrate is removed by etching until the second oxide layer under the first nitride layer is exposed.

8. The method as claimed in claim 1, wherein the fin structure is formed by etching the semiconductor substrate, and a material of the fin structure comprises single crystal silicon.

* * * * *